(12) United States Patent
Van Wijck

(10) Patent No.: US 7,022,184 B2
(45) Date of Patent: *Apr. 4, 2006

(54) ATOMIC LAYER CVD

(75) Inventor: Margreet Albertine Anne-Marie Van Wijck, Oldebroek (NL)

(73) Assignee: ASM International N.V., Bilthoven (NL)

( * ) Notice: Subject to any disclaimer, the term of this patent is extended or adjusted under 35 U.S.C. 154(b) by 253 days.

This patent is subject to a terminal disclaimer.

(21) Appl. No.: 10/461,893

(22) Filed: Jun. 12, 2003

(65) Prior Publication Data

US 2003/0209193 A1    Nov. 13, 2003

Related U.S. Application Data

(63) Continuation of application No. 09/611,536, filed on Jul. 7, 2000, now Pat. No. 6,585,823.

(51) Int. Cl.
*C30B 25/14*   (2006.01)

(52) U.S. Cl. .................. 117/201; 117/202; 117/86; 117/87; 117/94; 117/95

(58) Field of Classification Search ............... 117/201, 117/202, 200, 86, 87, 94, 95
See application file for complete search history.

(56) References Cited

U.S. PATENT DOCUMENTS

| 5,281,274 | A |   | 1/1994  | Yoder |
|-----------|---|---|---------|-------|
| 5,711,811 | A | * | 1/1998  | Suntola et al. ............. 118/719 |
| 5,879,459 | A |   | 3/1999  | Gadgil et al. |
| 6,042,652 | A | * | 3/2000  | Hyun et al. ................ 118/719 |
| 6,174,377 | B1|   | 1/2001  | Doering et al. |
| 6,313,047 | B1|   | 11/2001 | Hasebe et al. |
| 6,585,823 | B1| * | 7/2003  | Van Wijck ................... 117/89 |

FOREIGN PATENT DOCUMENTS

WO      WO 99/28527      6/1999

* cited by examiner

*Primary Examiner*—Robert Kunemund
(74) *Attorney, Agent, or Firm*—Knobbe, Martens, Olson & Bear, LLP

(57) ABSTRACT

Atomic layer deposition is used to provide a solid film on a plurality of disc shaped substrates. The substrates are entered spaced apart in a boat, in a furnace and heated to deposition temperature. In the furnace the substrate is exposed to alternating and sequential pulses of at least two mutually reactive reactants, in such way that the deposition temperature is high enough to prevent condensation of the at least two reactants on the surface but not high enough to result in significant thermal decomposition of each of the at least two reactants individually.

10 Claims, 4 Drawing Sheets

ATOMIC LAYER CVD

REFERENCE TO RELATED APPLICATION

This application is a continuation of application Ser. No. 09/611,536, filed on Jul. 7, 2000 now U.S. Pat. No. 6,585,823.

FIELD OF THE INVENTION

The present invention relates to a method for the deposition of a thin film onto a substrate by the technique of Atomic Layer Deposition.

BACKGROUND OF THE INVENTION

In the technique of Atomic Layer Deposition a substrate is exposed sequentially and alternately to at least two mutually reactive reactants. The substrate is heated to a temperature that is high enough to prevent condensation of the reactants but low enough to prevent thermal decomposition of each of the reactants. The substrate is exposed to the first reactant and the first reactant is chemisorbed onto the surface of the substrate until the surface is occupied with a monolayer of the first reactant. Then the chemisorption saturates and excess reactant is exhausted. Then the supply of the first reactant is cut-off and the reaction chamber is evacuated and/or purged to remove the traces of non-chemisorbed first reactant from the gas phase. Then the substrate is exposed to the second reactant which reacts with the chemisorbed first reactant under the formation of a solid film and the release of gaseous reaction products until the monolayer of the first reactant has fully reacted with the second reactant and the surface of the substrate is covered with a chemisorbed monolayer of the second reactant. Then the process saturates and excess of the second reactant is exhausted. This cycle can be repeated a number of times until a sufficiently thick film has been deposited onto the substrate. More than two reactants can be used, in particular for the deposition of ternary or more complicated compounds or multilayers. This technique has been known since 1980, see the review article of Suntola, "Atomic Layer Epitaxy" in: "Handbook of Christal Growth 3, Thin Films and Epitaxy, part B: Growth Mechanisms and Dynamics," by D. T. J. Hurle, Ed. Elsevier, 1994, Chapter 14, p 601–663. Because only a monolayer of the material is deposited per cycle, a sufficient number of cycles needs to be executed to achieve the required film thickness. In order to minimize the cycle time without compromising the effectiveness of the purging of the reactor, the volume of the reactor has been minimized and the flow dynamics of the reactor has been optimized. A first example of the reactor is given in U.S. Pat. No. 5,711,811 which is incorporated herein by reference. This patent describes a reactor in which a plurality of substrates can be processed simultaneously. In this reactor, a stack of narrowly spaced substrates is formed and the direction of the gas flow is parallel to the main surfaces of the substrates, an inlet located at one side of a substrate surface and the exhaust located at the other side of the substrate surface. Although it is an advantage that a plurality of substrates can be processed simultaneously, making the relatively slow technique more economical, it is a disadvantage that the formation of the stack of substrates needs to be carried out manually. In Finnish patent application Ser. No. 991078 of Microchemistry Oy is a single wafer reactor for Atomic Layer Deposition is described which allows robotic loading and unloading of the substrate. The disadvantage of the reactor is that only one wafer is processed at a time, using the relatively slow Atomic Layer Deposition technique. It is the object of the present invention to overcome these disadvantages and provide a method for operating the Atomic Layer Deposition technique that allows batch processing and robotic handling of the waters.

SUMMARY OF THE INVENTION

In accordance with one aspect of the invention, the Atomic Layer Deposition process is operated in a vertical hot wall LPCVD batch reactor. In such a reactor the lower end of the vertically elongated reaction chamber is provided with an opening for insertion and removal of a boat which comprises a number of mutually spaced supports to support the substrates in the horizontal orientation wherein the stack of mutually spaced substrates extends in the vertical direction. The reaction chamber is provided with at least one reactant inlet and a reactant exhaust as that a flow in the vertical direction is created. In the vertical direction the transport of reactants is determined by forced convective flow from the inlet end of the reactor towards the exhaust end of the reactor. In the narrow gap between the substrates, the transport of reactants is determined by diffusion. This occurs at a slower rate than the transport in the vertical direction. However, because of the large number of substrates, typically 50 to 200, cycle times which are an order of magnitude larger than the cycle times in a single wafer reactor can easily be accepted.

In normal Atomic Layer Deposition enough reactant needs to be supplied to saturate all the available surface sites with reactant. In the method of the present invention, in addition to this requirement, the supplied reactant should be given the opportunity to distribute itself over the whole batch of wafers. To this end, the present invention proposes to supply the reactant, eventually mixed with an inert gas like nitrogen, at one end of the reaction chamber while pumping at the other end of the reaction chamber such that during the period of supply of the reactant the volume of the reaction chamber is replaced a sufficient amount of times to reach even distribution but not so often that the required time per pulse becomes uneconomical long. Therefore, it is proposed to replace the volume of the reactor during the period of supply of the reactant at least one time to a maximum of 50 times, taken into account the average pressure in the reaction chamber during the period of supply of the reactant.

In a preferred embodiment it is proposed that during the time in between successive reactant pulses the reactor is evacuated and at least during part of this time an inert gas is fed into the reactor to drive the previous reactant pulse out of the annular space of the reactor while additionally during part of this time a pressure in the reactor is lower than the average pressure during the reactant exposure to allow diffusion of the reactant out of the narrow gap between the substrates.

In an alternative embodiment, following the Atomic Layer Deposition treatment, the substrate is possibly heated to a second temperature and reactants for a chemical vapor deposition process are introduced into the reactor. After completion of the deposition by chemical vapor deposition the supply of reactants is cut-off and after evacuating and/or purging the reaction chamber and when required backfilling it to atmospheric pressure, the substrate is removed from the reaction chamber.

DETAILED DESCRIPTION OF THE PREFERRED EMBODIMENT

Figure 1:
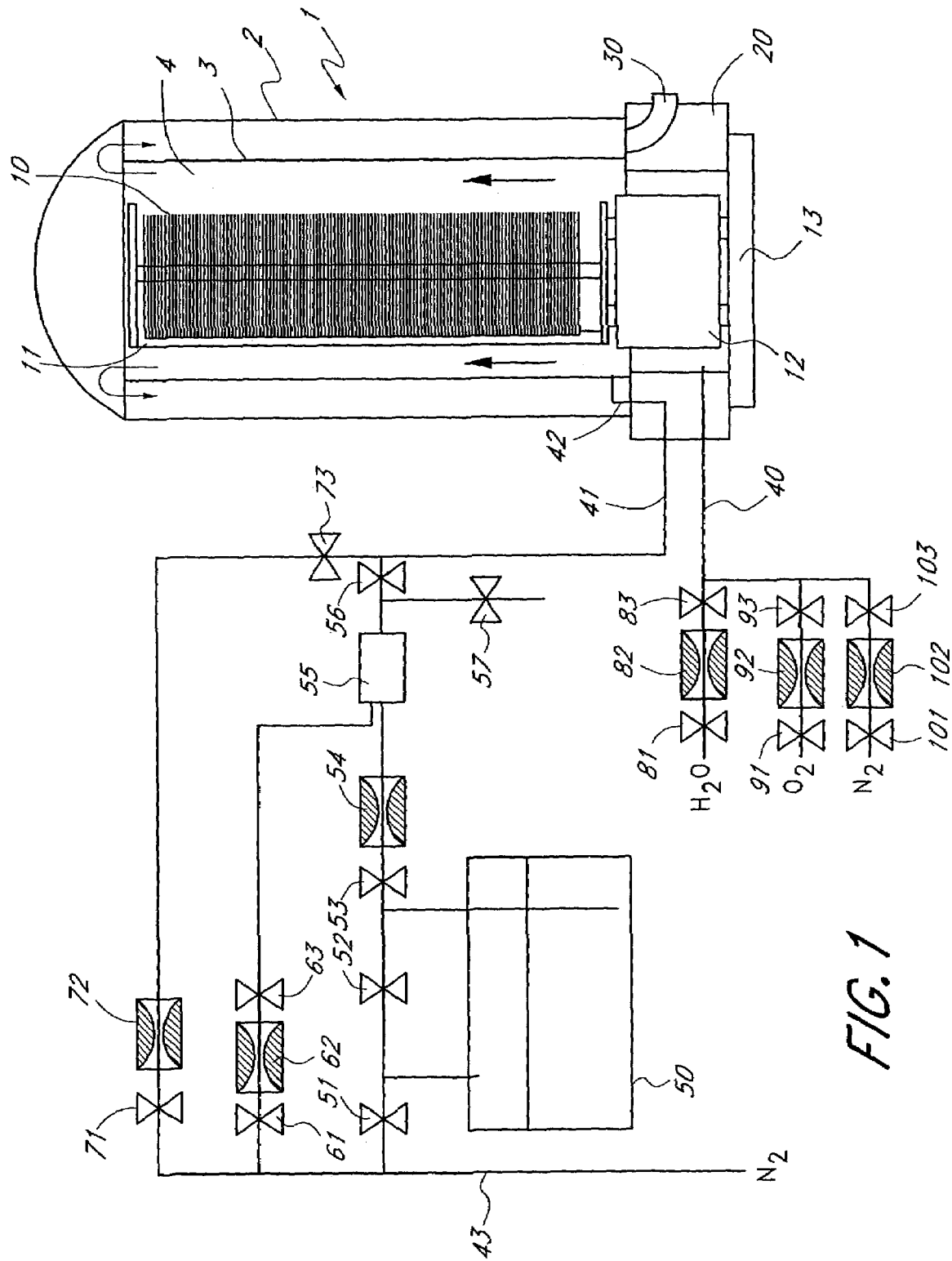
FIG. 1 Furnace with gas schematic.

FIG. 1 gives a schematical presentation of a gas system and furnace utilized for an embodiment of the method according to the invention for the purpose of tantalum oxide deposition. The furnace in its entirety is indicated by 1, the process tube by 2 and an inner liner by 3 which inner liner delimits a reaction chamber 4. The process tube 2 is surrounded by a heating element, not shown. A plurality of wafer like substrates 10 is placed in a holder 11 which holder is supported by a pedestal 12. The pedestal is supported by a doorplate 13 which closes the reaction chamber 4. The process tube 2 and inner liner 3 are supported by a flange 20. Gas is injected into the process chamber 4 by the gas supply lines 40 and 41, either directly or via a gas injector 42. The gas is exhausted via the gap between inner liner and process tube, through the gas exhaust line 30 towards the pump (not shown). A container with tantalum penta ethoxide 50 is connected to a nitrogen supply line 43 to be able to put the liquid source material under pressure. The flow of liquid source material is measured by liquid flow meter 54. In vaporizer unit 55 the flow of liquid source material is controlled, mixed with nitrogen and vaporized. The vaporized flow is fed into the gas supply line 41 by opening valve 56. Alternatively, before and after feeding the vaporized flow into the reactor, the flow can be directed towards the pump (not shown) by opening valve 57 while valve 56 is closed. The flow of nitrogen to the vaporizer unit 55 is controlled by mass flow controller 62 whereas mass flow controller 72 controls a flow of nitrogen directly fed into the gas supply line 41. Mass flow controllers 82, 92 and 102 control the flows of respectively $H_2O$, $O_2$ and $N_2$, fed into the reactor via gas supply line 40. Pneumatically operated shut-off valves 61, 71, 81, 91 and 101 provide in means to isolate the respective mass flow controllers from the gas supply lines at the upstream side and pneumatically operated valves 63, 73, 83, 93 and 103 provide in means to isolate the mass flow controllers at the downstream side. Shut-off valve 51 can isolate the tantalum penta ethoxide container 50 from the nitrogen supply line 43. Closing shut-off valve 53 interrupts the liquid tantalum penta ethoxide flow and opening valve 52 allows purging of the liquid flow controller 54 by $N_2$.

Figure 2:
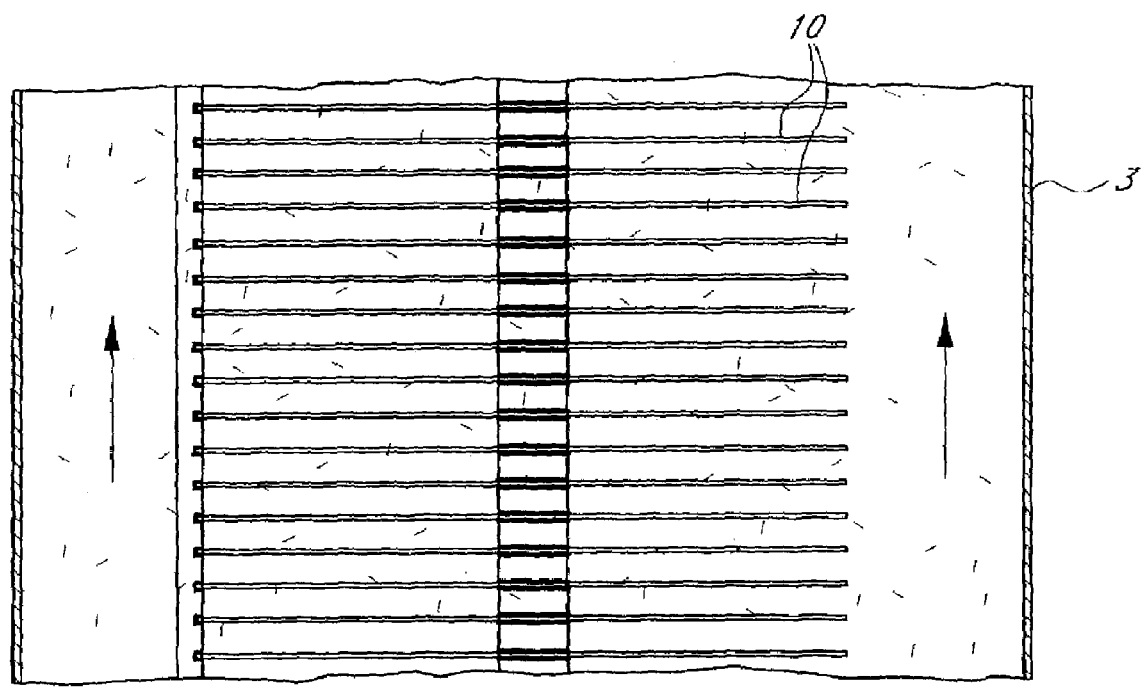
FIG. 2 Detailed part of cross-section through reaction chamber shown in FIG. 1 with wafers.
Figure 3A:
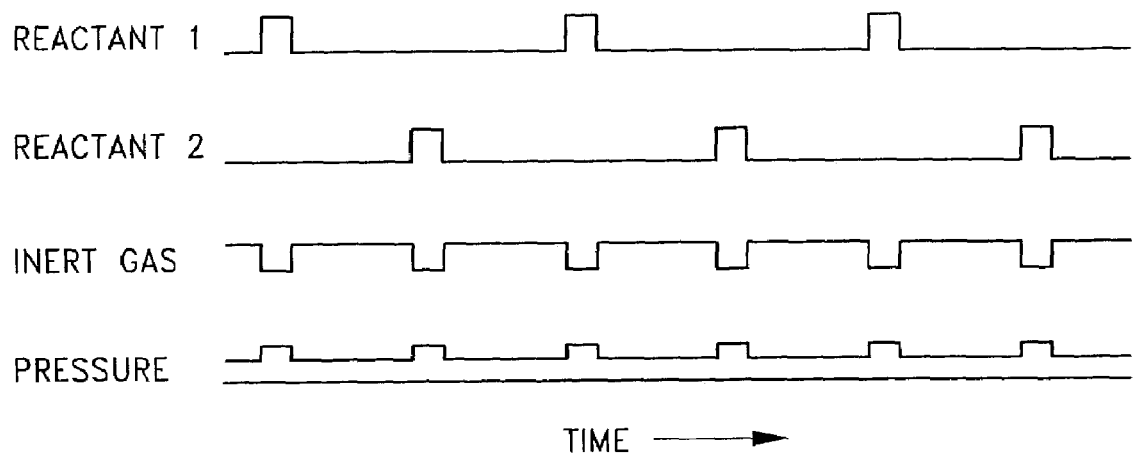
FIG. 3 Gas flows and pressure as a function of time.
Figure 3B:
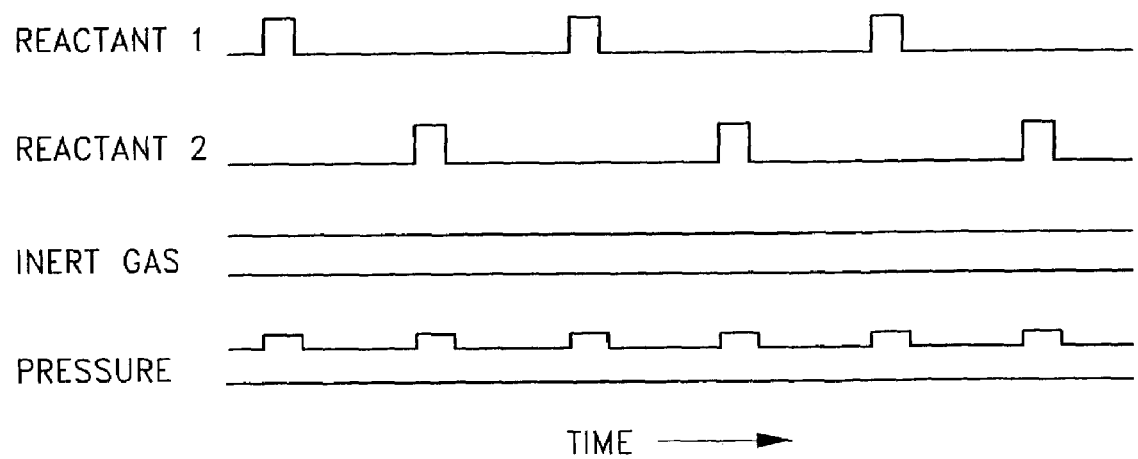
Figure 3C:
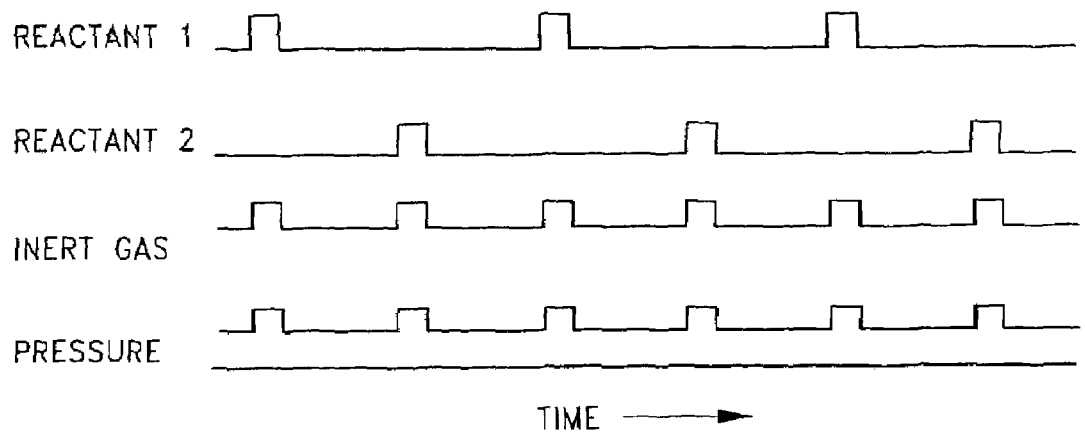
Figure 3D:
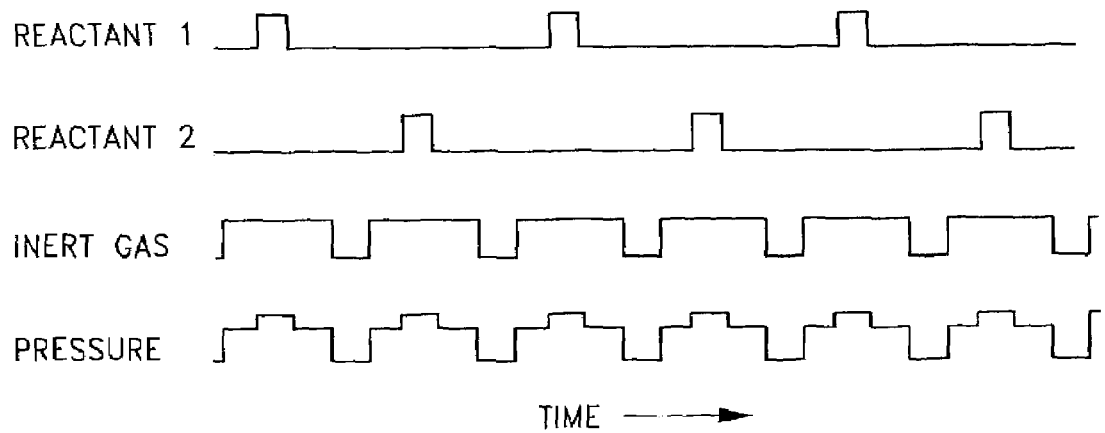

In FIG. 2, the gas flow geometry and wafer mounting are shown in more detail. Between the circumference of the circular wafer and the inner diameter of the inner liner is an annular space. Gas is transported in this annular space by means of forced convection. In the spacing between the wafers, gas transport occurs by diffusion.

In FIG. 3, examples of sequences of gas flows and of the corresponding pressure in the process tube as a function of time are presented. In a first example, presented in FIG. 3a, an inert gas flow is fed into the reactor in between the successive reactant pulses to drive the previous reactant pulse out of the reaction chamber. Although evacuation alone will remove the reactant from the reaction chamber, the concentration of the reactant will decrease with time roughly according to an exponential curve. In the initial stage the removal of the reactant from the chamber is efficient but in the exponential tail the removal is inefficient. The inert gas flow during the evacuation is instrumental in rapidly expelling this exponential tail. By selecting the inert gas flow and/or the pump capacity such that the pressure during the inert gas flow is lower than the pressure during the reactant pulses, the reactant can more easily diffuse out of the gap between the wafers towards the annular space where it is transported by convective flow towards the exhaust. Typically, also an inert gas flow will be applied during the flow of the reactant because it serves as a carrier gas for the reactant. FIGS. 3b–d shows three examples. A particularly preferred embodiment is shown in FIG. 3d wherein between the reactant pulses part of the time an inert gas flow is present and during part of the time no inert gas flow is present. In this way the advantages of both situations are exploited to the full extend: the inert gas flow to drive the reactant out of the annular space and a very low pressure to promote diffusion of the reactant out of the gap between the wafers. The interruption of the $N_2$ flow in between successive reactant pulses can be applied more than once in order to achieve a very efficient "cycle purging."

EXAMPLE 1

A specific example of a process in accordance with the invention is the following. After inserting a holder containing a plurality of substrates into a hot wall batch reactor, the substrates are heated to 220° C. As a first reactant, Tantalum Pentaethoxide (TAETO,=Ta—(0—$C_2H_5$)$_5$) mixed with nitrogen is admitted into the reactor while pumping at the exhaust end of the reactor and maintaining a pressure of 1 Torr. The temperature of the vessel containing the (TAETO) is maintained at 35° C. A nitrogen pressure is applied to the vessel and a flow and liquid TAETO corresponding to a vapor flow of 9 sccm, is fed from the vessel into an evaporator. A flow of nitrogen of 500 sccm is also fed into the evaporator. TAETO vapor, together with the nitrogen gas flow is fed from the evaporator into the reactor. The duration of the TAETO exposure is 2 min. After cut-off of the TAETO supply the reactor is purged for 2 minutes with approximately 500 sccm $N_2$, the $N_2$ flow is interrupted for 30 seconds while the evacuation is continued and the $N_2$ flow is switched on again for 2 minutes. Then a flow of water vapor of 500 sccm is supplied to the reactor during 2 minutes, followed by a purge/evacuate/purge sequence. This whole cycle is repeated a number of times, according to the required film thickness. Finally, the reaction chamber is purged/evacuated, the chamber backfilled to 1 atm. if required, and the holder with wafers is unloaded from the reaction chamber.

In an advantageous embodiment, during the supply of the TAETO via injector 42, a nitrogen flow is fed into the reactor via line 40, preventing the upstream diffusion of the TAETO vapor to the relatively cool flange (20) and door plate (13) where it could give rise to loosely adhering deposits, flaking and particles.

We claim:
1. An assembly for atomic layer deposition on a plurality of substrates, comprising:
   at least two sources of mutually reactive reactants;
   a reactor connected to the at least two sources, wherein the reactor has a reaction chamber for accommodating the substrates, wherein the reaction chamber is delimited by a liner and wherein the reactor is configured to maintain the substrates at a temperature high enough to prevent condensation of the reactants on the substrates but not high enough to result in a significant thermal decomposition of the reactants individually; and a holder for receiving and positioning each of the substrates in the reaction chamber, wherein the holder is separate from the reactor and is able to be entered and removed from the reactor and wherein the holder comprises at least three columns that have mutually spaced recesses to receive an edge of each of the substrates to allow the substrates to rest vertically spaced apart and substantially horizontally in the holder, wherein an annular passage is defined between the liner and edges of the substrates, wherein the annular passage is configured to allow the mutually reactive reactants to flow in a direction substantially perpendicular to a major surface of each of the substrates and wherein the holder and the annular passage are configured to allow horizontal diffusion of the reactants over the major surfaces of the substrates.

2. An assembly according to claim 1, comprising at least one valve in a connection between each of the at least two sources and the reactor, and a controller connected to the valves, the controller and the valves configured to supply the mutually reactive reactants in alternating and sequential pulses to the reaction chamber.

3. An assembly according to claim 2, wherein one of the reactants is in a liquid state at room temperature and standard atmospheric pressure and wherein the assembly further comprises a liquid flow controller to control a flow of the liquid reactant and a vaporizer to evaporate the liquid reactant prior to supply of the reactant to the reactor.

4. An assembly according to claim 3, wherein one of the at least two sources comprises tantalum pentaethoxide.

5. An assembly according to claim 3, wherein one of the at least two sources comprises $H_2O$.

6. An assembly according to claim 2, further comprising a source of inert gas connected to the reactor and an inert gas valve in an inert gas connection between the source of inert gas and the reactor, the inert gas valve being connected to the controller, the inert gas valve and the controller configured to supply the inert gas to the reaction chamber between the alternating and sequential pulses of the at least two mutually reactive reactants.

7. An assembly according to claim 6, wherein the source of inert gas comprises nitrogen gas.

8. An assembly according to claim 1, wherein the reactor comprises a process tube, the process tube coaxially aligned with and having a diameter greater than the liner, wherein a gap between the process tube and the liner is configured to allow the reactants to exit the reaction chamber above an uppermost substrate of the plurality of substrates.

9. An assembly according to claim 1, wherein the reactor comprises a pedestal under the holder for supporting the holder.

10. An assembly according to claim 9, wherein the reactor comprises a door plate under the pedestal for supporting the pedestal, the door plate configured to open and close to allow the holder to enter and be removed from the reactor.

* * * * *